(12) United States Patent
Lynch et al.

(10) Patent No.: US 9,276,554 B2
(45) Date of Patent: Mar. 1, 2016

(54) BROADBAND NON-FOSTER DECOUPLING NETWORKS FOR SUPERDIRECTIVE ANTENNA ARRAYS

(71) Applicant: HRL LABORATORIES, LLC, Malibu, CA (US)

(72) Inventors: Jonathan J. Lynch, Oxnard, CA (US); Carson R. White, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 296 days.

(21) Appl. No.: 13/856,403

(22) Filed: Apr. 3, 2013

(65) Prior Publication Data

US 2014/0300431 A1    Oct. 9, 2014

(51) Int. Cl.
*H01Q 21/00* (2006.01)
*H03H 7/48* (2006.01)
*H03H 7/52* (2006.01)

(52) U.S. Cl.
CPC ................. *H03H 7/485* (2013.01); *H03H 7/48* (2013.01); *H03H 7/52* (2013.01)

(58) Field of Classification Search
CPC .......... H03H 7/485; H03H 7/52; H03H 7/748
USPC ........................... 343/853, 860, 722, 745, 749
See application file for complete search history.

(56) References Cited

U.S. PATENT DOCUMENTS

| | | | |
|---|---|---|---|
| 6,121,940 A | 9/2000 | Skahill et al. | 343/850 |
| 6,249,261 B1 | 6/2001 | Solberg | |
| 7,307,494 B2 | 12/2007 | Erb | |
| 7,688,273 B2 | 3/2010 | Montgomery et al. | 343/893 |
| 7,898,493 B1 | 3/2011 | Rojas et al. | |
| 2003/0201843 A1 | 10/2003 | Luen et al. | |
| 2009/0184879 A1 | 7/2009 | Derneryd | |
| 2010/0188300 A1 | 7/2010 | Anguera et al. | |
| 2010/0248651 A1 | 9/2010 | Dent | |
| 2011/0165853 A1 | 7/2011 | Robert | |
| 2011/0188552 A1 | 8/2011 | Yoon et al. | |
| 2011/0228713 A1 | 9/2011 | Nicolaos et al. | |
| 2013/0293435 A1 | 11/2013 | White | |

FOREIGN PATENT DOCUMENTS

| | | |
|---|---|---|
| CN | 102201614 A | 9/2011 |
| JP | 2011-205316 | 10/2011 |

OTHER PUBLICATIONS

Coetzee, Dual-Frequency Decoupling Networks for Compact Antenna Arrays, Hindawi Publishing Corporation, International Journal of Microwave Science and Technology, vol. 2011, Article ID 249647, 3 pages.*

(Continued)

*Primary Examiner* — Dieu H Duong
(74) *Attorney, Agent, or Firm* — Ladas & Parry

(57) ABSTRACT

A four port antenna decoupling network which has only two negative capacitors and four or more positive capacitors and a method of improving low frequency receiving performance of two element and four element antenna arrays using one or more wideband decoupling circuits wherein each of said wideband decoupling circuits contain a maximum of two non-Foster components, the two non-Foster components preferably simulating negative capacitors.

18 Claims, 4 Drawing Sheets

(56) References Cited

OTHER PUBLICATIONS

Hirvonen et al, Bandwidth Limitations of Dipoles Matched With Non-Foster Impedances, Proceedings of European Conference on Antennas Propagat. Eucap 2007, Nov. 2007, 5 pages.*
From U.S. Appl. No. 13/856,375, filed Apr. 3, 2013, (now published as US 2013-0293435 A1), Application and Office Actions.
PCT International Preliminary Report on Patentability Chapter II from PCT/US2013/035183 dated Sep. 15, 2014.
PCT International Preliminary Report on Patentability Chapter I from PCT/US2013/035183 issued on Oct. 2014.
PCT International Preliminary Report on Patentability Chapter I from PCT/US2013/035185 issued on Oct. 7, 2014.
White, Carson R., "A non-foster monopole array," Antennas and Propagation Society International Symposium (APSURSI), 2012 IEEE, 2 pages.
White, Carson R., et al., "A Non-Foster VHF Monopole Antenna," IEEE Antennas and Wireless Propagation Letters, vol. 11, 2012, pp. 584-587.
R.C. Hansen, "Fundamental Limitations in Antennas", *Proceedings of the IEEE*, 69(2), 1981, pp. 170-182.
K. Buell, et al. "Metamaterial Insulator Enabled Superdirective Array", *IEEE Transactions on Antennas and Propagation*, 55(4), 2007, pp. 1074-1085.
M.M. Dawould, et al., "Superdirectivity with Appreciable Bandwidth in Arrays of Radiating Elements Fed by Microwave Transistors", *Proceedings of the 4th European Microwave Conference*, Montreux, Switzerland, 1974, pp. 278-282.
C.K. Edwin Lau, et al., "Minimum Norm Mutual Coupling Compensation with Applications in Direction of Arrival Estimation", *IEEE Transactions on Antennas and Propagation*, 52(8), 2004, pp. 2034-2041.
C. Volmer, et al. "Broadband Decopuling and Matching of a Superdirective Two-Port Antenna Array", *IEEE Antennas and Wireless Propagation Letters*, vol. 7, 2008, pp. 613-616.
S.E. Sussman-Fort, et al.., "Non-Foster Impedance Matching of Electrically-Small Antennas", *IEEE Transactions on Antennas and Propagation*, 57(8), 2009, pp. 2230-2241.
J.G. Linvill, "Transistor Negative-Impedance Converters", *Proceedings of the Institute of Radio Engineers*, 41(6), 1953, pp. 725-729.
S.E. Sussman-Fort, et al., "Progress in Use of Non-Foster Impedances to Match Electrically-Small Antennas and Arrays", *Proceedings of the Antenna Applications Symposium*, 2005, pp. 89-108.
R.C. Hansen, "Wideband Dipole Arrays Using Non-Foster Coupling", *Microwave and Optical Technology Letters*, 38(6), 2003, pp. 453-455.
A. Platzker et al., "Rigorous Determination of the Stability of Linear N-Node Circuits from Network Determinants and the Appropriate Role of the Stability Factor K of their Reduced Two-Ports," *Third International Workshop on Integrated Nonlinear Microwave and Millimiterwave Circuits*, 1994, pp. 93-107.
J.C. Coetzee, et al., "Port Decoupling for Small Arrays by Means of an Eigenmode Feed Network", *IEEE Transactions on Antennas and Propagation*, 56(6), 2008, pp. 1587-1593.
J. J. Lynch, "A Modal Description of Multiport Antennas", *International Journal of Antennas and Propagation*, vol. 2011, 2011, Article ID 438437, 12 pages.
N. Marcuvitz (ed.), *Waveguide Handbook*, McGraw-Hill, NY, 1951, p. 117.
From U.S. Appl. No. 13/856,375 (now published as US 2013-0293435 A1), Notice of Allowance mailed on Aug. 12, 2015.
Allen, John L., "Gain and impedance variation in scanned dipole arrays," IRE Transactions on Antennas and Propagation, Sep. 1962, pp. 566-572.
Chaloupka, H.j., Wang, X. and Coetzee, J.C., "A superdirective 3-element array for adaptive beamforming," Microwave and Optical Technology Letters, vol. 36, No. 6, pp. 425-430, 2003.
Chen, S.C., Wang, Y.S., and Chung, S.J., "A decoupling technique for increasing the port isolation between two strongly coupled antennas," IEEE Transactions on Antennas and Propagation, vol. 56, No. 12, pp. 3650-3658, 2008.
Chua, P.T. and Coetzee, J.C., "Microstrip decoupling networks for low-order multi-port arrays with reduced element spacing," Microwave and Optical Technology Letters, vol. 46, No. 6, pp. 592-597, 2005. (16 pages).
Coetzee, J.C. and Yu, Y., "Closed-form design equations for decoupling networks of small arrays," Electronics Letters, vol. 44, No. 25, pp. 1441-1442, 2008.
Coetzee, J.C. and Yu, Y., "Design of decoupling networks for circulant symmetric antenna arrays," IEEE Antennas and Wireless Propagation Letters, vol. 8, pp. 291-294, 2009.
Ludwig, A.C., "Mutual coupling, gain and directivity of an array of two identical antennas," IEEE Transactions on Antennas and Propagation, vol. 24, No. 6, pp. 837-841, 1976.
Pozar, D.M. Microwave Engineering, John Wiley & Sons, Hoboken, NJ, USA, 2005. (16 pages, preface and table of contents).
Weber, J., Volmer, C., Blau, K., Stephan, R. and Hein, M.A., "Miniaturized antenna arrays using decoupling networks with realistic elements," IEEE Transactions on Microwave Theory and Techniques, vol. 54, No. 6, pp. 2733-2740, 2006.
From U.S. Appl. No. 13/856,375 (now published as US 2013-0293435 A1), Office Action mailed on Apr. 7, 2015.
Hansen, "Non-Foster and connected planar arrays," Radio Science, vol. 39, RS4004, doi:10.1029/2004RS003043, 2004, pp. 1-14.
ISR and WO for related PCT/US2013/035185 mailed on Jul. 25, 2013.
ISR and WO for related PCT/US2013/035183 mailed on Jul. 25, 2013.
Chua, Ping Tyng, et al. "Microstrip Decoupling Networks for Low-Order Multi-Port Arrays with Reduced Element Spacing", Microwave and Optical Technology Letters, Sep. 20, 2005, vol. 46, Issue 6, pp. 592-597.
Yazdanbakhs, P., et al. "Optimization of Monopole four-Square Array Antenna using a decoupling network and a neural network to model ground plane effects", In: Antennas and Propagation, 2009. EuCAP 2009, $3^{rd}$ European Conference, Mar. 23-27, 2009, pp. 3014-3018.
Zhang, et al. "Design and Investigation of Broadband Monopole Antenna Loaded with Non-Foster Circuit," 2010, Progress in Electromagnetics Research C. vol. 17, pp. 245-255.
From Chinese Patent Application No. 201380009745.8, PRC Office Action dated Nov. 27, 2015 with English summary.
From European Patent Application No. 13772971.1, EPO Supplementary European Search Report with European Search Opinion dated Nov. 9, 2015.

* cited by examiner

Fig. 5a
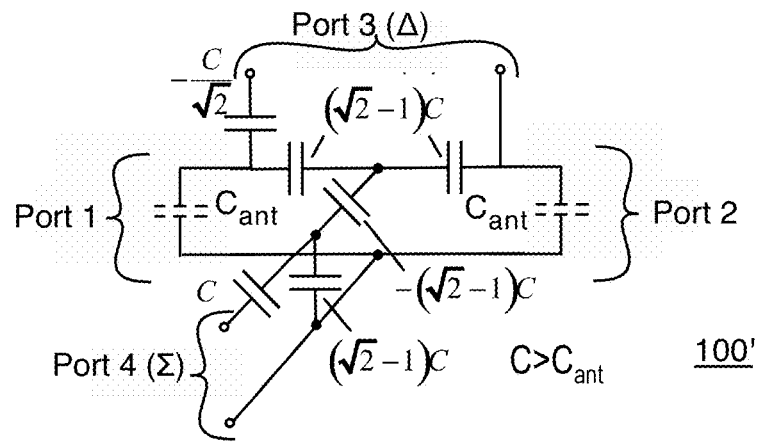
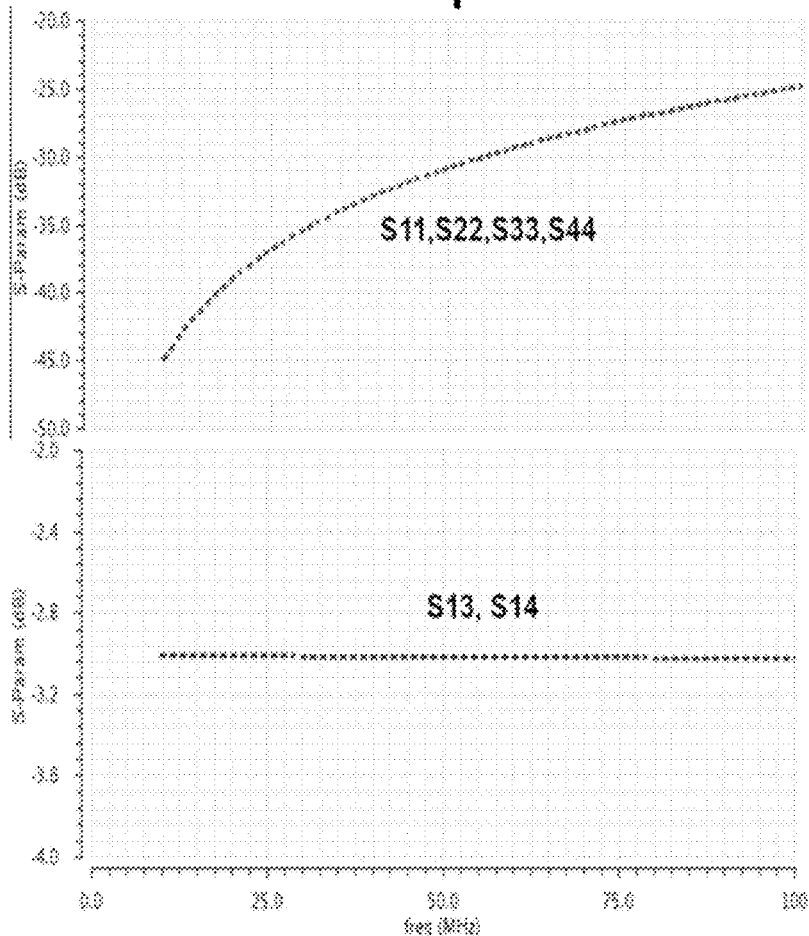
Fig. 6

BROADBAND NON-FOSTER DECOUPLING NETWORKS FOR SUPERDIRECTIVE ANTENNA ARRAYS

CROSS REFERENCE TO RELATED APPLICATIONS

This application is related to U.S. Provisional Patent Application Ser. No. 61/620,384 filed Apr. 4, 2012 and entitled "Antenna Array with Wide-band Reactance Cancellation" the disclosure of which is hereby incorporated herein by reference. This application is also related the non-provisional application based namely U.S. patent application Ser. No. 13/856,375 filed on the same date as this application and entitled "Antenna Array with Wide-band Reactance Cancellation" the disclosure of which is also hereby incorporated herein by reference.

STATEMENT REGARDING FEDERALLY SPONSORED RESEARCH OR DEVELOPMENT

None.

TECHNICAL FIELD

This invention relates to a method and apparatus for improving the sensitivity of receiving antenna arrays, especially those that operate at frequencies where the spacing of the antenna elements is smaller than half a wavelength (and thus comprises a superdirective array of antennas). Array sensitivity is improved through the use of a decoupling network that utilizes non-Foster circuit elements (i.e., negative capacitors) to achieve wideband operation as well as antenna reactance cancellation. Decoupling networks improve sensitivity by separating the antenna array modes so that each mode may be impedance matched separately and simultaneously, allowing the energy in each mode to be efficiently extracted. Although such use of traditional passive decoupling networks is known to those skilled in the art, this invention uses non-Foster circuit elements incorporated into decoupling networks to obtain broadband operation and obviate, in preferred embodiments thereof, a need for separate impedance coupling networks.

BACKGROUND

Non-Foster circuit elements, such as negative capacitors and inductors, have been studied for many years as a means to extend the bandwidth of antennas to the low frequency (i.e., small antenna) regime. An example is: G. Skahill, R. M. Rudish, and J. A. Piero, Apparatus and method for broadband matching of electrically small antennas, U.S. Pat. No. 6,121, 940.

There have been some publications that report simple inter-element coupling using non-Foster elements, such as: R. C. Hansen, "Wideband Dipole Arrays using wideband coupling," *IEEE Microwave and optical tech letters*, vol. 38, no. 6, 2003. In this paper Hansen simulates a planar array of dipole elements whose ends are connected with lumped negative inductors. The simulated results show high array gain over a broad bandwidth. This approach does not attempt to decouple and impedance match the antenna modes.

Mode decoupling networks have been reported in the literature as a means to improve the performance of antenna arrays when the inter-element spacing drops below half a wavelength. Examples of decoupling networks may be found in: C. Volmer, et. al, "Broadband decoupling and matching of a superdirective two port antenna array," IEEE antennas and propagation letters, vol 7, 2008; and J. C. Coetzee, et. al., "port decoupling for small arrays by means of an eigenmode feed network," IEEE trans. On antennas and propagation, vol 56, no. 6 June 2008. These papers do not consider Non-Foster circuit elements to extend the performance bandwidth.

BRIEF DESCRIPTION OF THE INVENTION

In one aspect the present invent provides a four port antenna decoupling network which has only two negative capacitors and four or more positive capacitors.

In another aspect the present invention provides a four port antenna decoupling network having: (a) first and second ports coupled, in use, either directly to antenna elements or indirectly to antenna elements; (b) third and fourth ports coupled, in use, either directly or indirectly to radio transmitting and/or receiving apparatus; (c) the first and second ports each having first connection points and second connection points, the first connection points of the first and second ports being directly connected to each other, the second connection points of the first and second ports being connected to each other via at least a pair of positive capacitors, the pair of positive capacitors having a common junction point between them; (d) the third port having first connection points and second connection points, the first connection point of the third port being capacitively coupled to a first one of said pair of positive capacitors with a first negative capacitor and the second connection point of the third port being directly coupled to a second one of said pair of positive capacitors; (e) the fourth port having first connection points and second connection points, the first connection point of the fourth port being directly coupled to the first connection points of the first and second ports, and the second connection point of the fourth port being coupled to (i) the first connection point of the fourth port and (ii) the common junction point between the pair of positive capacitors via a π network of three capacitors one of which is a negative capacitor.

In yet another aspect the present invention provides a method of improving low frequency receiving performance of two element and four element antenna arrays using one or more wideband decoupling circuits wherein each of said wideband decoupling circuits contain a maximum of two non-Foster components.

BRIEF DESCRIPTION OF THE DRAWINGS

FIG. 5a is a slightly modified version of FIG. 5 where antenna capacitance forms part of the broadband 180 deg coupler. The capacitance value C noted in the network is preferably chosen to be close to, but slightly greater than, the antenna capacitance.

FIG. 6 depicts a simulation results showing the magnitudes of S parameters for the 180 deg hybrid coupler. Nearly ideal performance extends over 1 decade of bandwidth.

DETAILED DESCRIPTION

Superdirective antennas are antenna arrays with an element spacing less than about a quarter wavelength at the antenna's operating frequency. The individual antenna elements may each comprise a dipole antenna, a monopole antenna (typically or ideally with a ground plane), patch antennas, etc. The individual antenna elements are closely spaced (typically spaced such that adjacent active antenna elements are spaced by no more than $$\frac{\lambda}{4}$$

where $\lambda$ is the wavelength of the antenna's operating frequency) in order to make the array "superdirective". See FIG. 1 which depicts a superdirective antenna array 10 having four antenna elements $10_1$-$10_4$ coupled via an antenna network S to a decoupling network $S_u$ to deliver four Modes (Mode 1-Mode 4) to four radio receivers or transceivers (not shown).

The foregoing discussion is written in terms of the four antenna elements $10_1$-$10_4$ being receiving antennas, but it should be understood the invention disclosed herein also applies to transmitting modes as well, so the disclosed decoupling network $S_u$ may be used in both receiving and transmitting applications.

Figure 1:
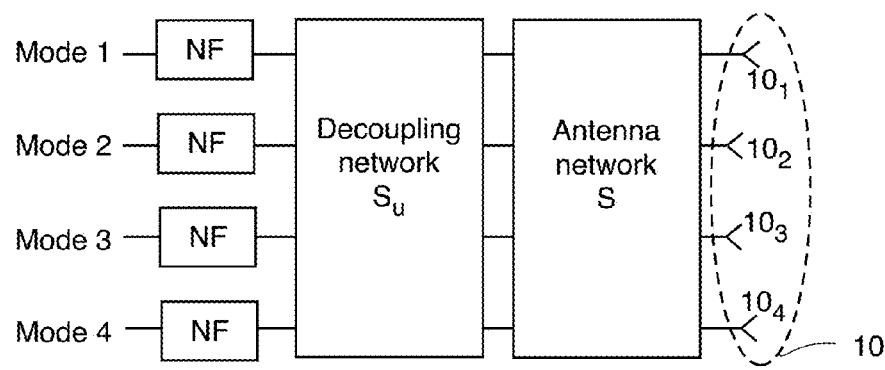
FIG. 1 is a block diagram of antenna, decoupling, and non-foster (NF) matching networks. The decoupling network separates the modal power and allows for each output port to be impedance matched independently, thus maximizing received power.

FIG. 1 shows connections to four physical antennas $10_1$-$10_4$ on the right which may be wire antennas such as monopole or dipole antennas. The antenna network S typically represents the mutual and self-impedance values between the physical antennas. Thus the antenna network S is usually a given depending on the physical arrangement of the physical antennas $10_1$-$10_4$. For example, four antennas arranged in a straight line will have a different antenna network S than four antennas arranged in a circle. The antenna network S may be determined through measurement or through simulation or as taught by U.S. patent application Ser. No. 13/856,375 filed on the same date as this application and entitled "Antenna Array with Wide-band Reactance Cancellation". The decoupling network is added by the user to separate out the input for each radiation mode. The NF circuits in FIG. 1 are impedance matching circuits between the inputs (Mode 1-4) and the antenna itself (Decoupling network $S_u$, Antenna network S and the antennas). The output power of the antenna system in FIG. 1 (without implying a limitation and assuming a receiver embodiment) is the sum of the power received at each mode.

Four Non-Foster circuits NF are shown between the decoupling network $S_u$ and the lines labeled Modes 1-4. The Four Non-Foster circuits NF are in one sense optional since whether or not they are needed or desirable will depend on the impedance match between the four Modes (Mode 1-Mode 4) of four radio receivers or transmitters or transceivers and the impedance at the corresponding ports of the decoupling network $S_u$. The Antenna Network S depicted in FIG. 1 can be a network which is designed and/or one which simply results from the fact that the antenna elements are closely spaced and therefore are not independent of each other (which is typically referred to as mutual coupling), as discussed in the preceding paragraph. Preferably Antenna Network S depicted in FIG. 1 is a network which merely represents the mutual coupling resulting from the fact that the antenna elements are closely spaced in superdirective antenna embodiments.

The four modes in FIG. 1 can represent the inputs or outputs for radio receivers, transmitters or transceivers. The decoupling network $S_u$ described herein works well with antenna arrays which are reciprocal (they can both receive and transmit, if desired), and therefore also works well with non-reciprocal antenna arrays which are either receive or transmit only.

FIG. 1 shows four modes and four antennas $10_1$-$10_4$. The decoupling network described herein can also work with two modes (and therefore two antennas), and not just the four modes (and four antennas $10_1$-$10_4$ of FIG. 1). The preferred embodiment of present invention is a decoupling network (described in detail with reference to FIG. 5) for two antenna elements and four of the decoupling networks of FIG. 5 can be combined to decouple four antenna elements arranged in a circle, as is explained below with reference to FIG. 8. In addition to the active elements $10_1$-$10_4$ depicted in FIG. 1, each antenna element $10_1$-$10_4$ can have one or more passive antenna elements associated with same if desired.

Figure 2:
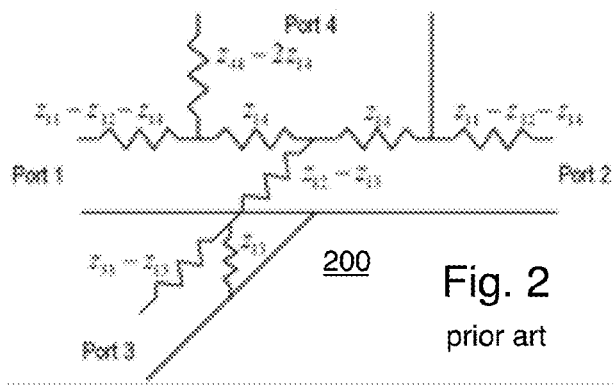
FIG. 2 is a circuit schematic for general Magic-T structure. Ports 3 and 4 are isolated from one another through symmetry.
Figure 2A:
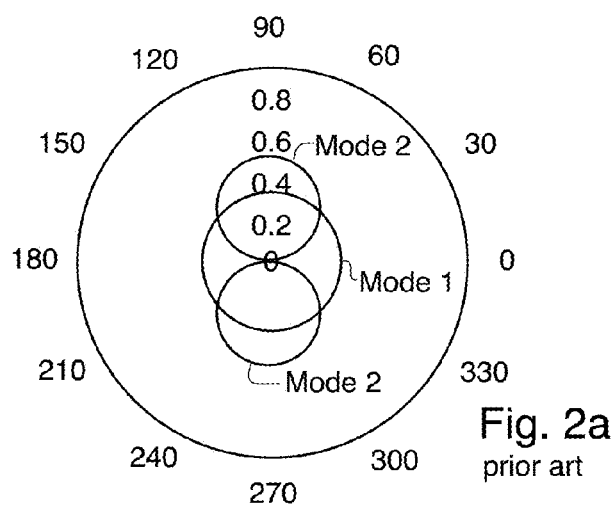
FIG. 2a shows the radiation pattern (with Modes 1 and 2 defined) for an antenna array having two elements.

The reception of a multiport antenna array 10 may be improved by ensuring that all of the modes are well matched using a decoupling network S. The modal theory of antennas (see J. J. Lynch, "A modal analysis of multiport antennas," Int. Journal of Antennas and Prop., vol. 2011, Article ID 438437) shows that the radiating properties of an array of N antennas may be completely described by exactly by N radiation modes. For reciprocal antennas, the receiving patterns are the same as transmitting patterns so the N modes also completely describe the receiving properties of the antenna array 10. Maximum power is received by an array 10 when all N modes are impedance matched to a set of loads. In general, achieving this impedance match is extremely difficult due to mutual coupling between the antenna elements $10_1$-$10_N$ in a superdirective antenna array. If the RF characteristics of the antenna array are represented by its scattering matrix S, the load network that results in maximum received power is one that has a scattering matrix equal to S* (the conjugate of S). Given such a matrix, it is not readily apparent how a corresponding load network may be constructed at a single frequency, much less over a broad bandwidth. FIG. 2a depicts the radiation patterns (Modes 1 and 2) for a two element antenna. Antenna elements in FIG. 2a are $\lambda/10$ apart. Mode 1 is the sum of the individual patterns for the two elements and mode 2 is the difference of the individual patterns of the two elements.

The modal description allows one to (in theory) channelize the modes, funneling the energy to different ports that are all isolated from one another. When the ports are isolated, one may implement an impedance matching network at each port separately to obtain the maximum received (or transmitted) power. In practice one may build such decoupling networks from passive, reciprocal components. For an N element antenna array with a scattering matrix S, the 2N port decoupling network with scattering parameters $$S_u = \begin{pmatrix} 0 & U^T \\ U & 0 \end{pmatrix} \quad \text{(Eqn. 1)}$$

will decouple the array if we choose the N×N submatrix U to have columns equal to the eigenvectors of $S^H S$ (where the superscript H denotes conjugate transpose). Note that the zero entries are actually N×N submatrices of zeroes. We can see from that the ideal decoupling network has matched input and output ports (when the ports are terminated in their desired impedances) and funnels energy incident on one side to the other side with modified amplitudes and phases (according to U). Thus, the output of one port is a linear combination of the signals incident from ports on the other side of the circuit. Because the matrix U is the eigenvector matrix of a Hermetian matrix, it is unitary: $U^H U = I$ (where I is the identity matrix). Thus, ideally the decoupling network $S_U$ is lossless and reciprocal. In practice there will be some losses so $S_u$ represents the ideal performance to be obtained only in the absence of losses. Note that at this point, while the values of U are known and hence the values of $S_U$ are known, nothing is known as to how to implement $S_U$ physically.

With the decoupling network attached to the antenna array, the scattering matrix seen looking back from the decoupling network $S_U$ outputs is Γ, an N×N diagonal matrix, as indicated in FIG. 1. The diagonal elements of Γ are the reflection coefficients for each of the modes. Since all of the off-diagonal elements are zero, these output ports are decoupled. Thus each port may be presented with a matched load Γ to ensure maximum power transfer to that load. The combination of the matched loads together with the decoupling network creates the scattering matrix S* as seen from the antenna ports for maximum power transfer. To obtain wideband performance the output matching network S as well as the decoupling network $S_u$ itself may be constructed using non-Foster networks.

Although decoupling the modes allows one to match each of the modes separately, realizing the decoupling network is generally of the same order of difficulty as realizing S*. Certain antenna arrays of practical interest possess symmetries that result in known decoupling matrices whose elements are independent of frequency. For example, the decoupling matrix U for N element circular arrays of identical elements has values given by $$U_{n,m} = \frac{1}{\sqrt{N}} e^{-j\frac{2\pi nm}{N}} \text{ with } n, m = 0, 1, \ldots, N-1 \quad \text{(Eqn. 2)}$$

It should be noted that the decoupling matrix is not unique: one may multiply any of the columns of U by a complex constant and preserve its decoupling characteristics. This is equivalent to inserting a fixed phase shift at the corresponding port on the left (output) side of the decoupling network. Note also that this matrix and therefore the decoupling network $S_U$ parameters are independent of frequency.

Two configurations of antennas will be considered here, arranged in a circular pattern. The decoupling network $S_U$ will be specified for a two antenna array and a four antenna array. The decoupling network $S_U$ will be based on the "Magic T" network shown in FIG. 2. That is, the decoupling network $S_U$ will be realized as comprising circuits as shown in FIG. 2 but with a specific relationship between the component values.

The simplest case is two elements (N=2) for which the decoupling matrix is $$U = \frac{1}{\sqrt{2}} \begin{pmatrix} 1 & 1 \\ 1 & -1 \end{pmatrix}.$$

The scattering matrix (Eqn. 1) for this matrix is commonly called a 180 degree coupler. We may implement this 180 degree coupler using a magic-T, a structure that is known to those skilled in the art (see N. Marcuvitz, "Waveguide handbook," Radiation Lab Series, Vol. 10, McGraw-Hill, NY, 1951, p. 117), and with its equivalent network shown in FIG. 2. The Z parameter matrix for this network may be written down by inspection:

$$Z = \begin{pmatrix} z_{11} & z_{12} & z_{13} & z_{14} \\ z_{12} & z_{11} & z_{13} & -z_{14} \\ z_{13} & z_{13} & z_{33} & 0 \\ z_{14} & -z_{14} & 0 & z_{44} \end{pmatrix} \quad \text{(Eqn. 3)}$$

It may be noted that $Z_{22}=Z_{11}$, $Z_{12}=Z_{21}$ and so on as dictated by the symmetry of Z.

We may ensure perfect input/output impedance matches when the ports are terminated in their reference impedances by enforcing the following conditions $$z_{11}z_{12}=z_{33},(z_{11}+z_{12})^2=2z_{13}^2+1, z_{11}-z_{12}= \\ z_{44},(z_{11}-z_{12})^2=2z_{14}^2+1 \quad \text{(Eqn. 4)}$$

With these conditions, and assuming a lossless network ($z_{11}=jx_{11}$, etc.), the scattering matrix for the decoupling network is $$S_u = \begin{pmatrix} 0 & 0 & \frac{jx_{13}}{1 \pm \sqrt{1-2x_{13}^2}} & \frac{jx_{14}}{1 \pm \sqrt{1-2x_{14}^2}} \\ 0 & 0 & \frac{jx_{13}}{1 \pm \sqrt{1-2x_{13}^2}} & -\frac{jx_{14}}{1 \pm \sqrt{1-2x_{14}^2}} \\ \frac{jx_{13}}{1 \pm \sqrt{1-2x_{13}^2}} & \frac{jx_{13}}{1 \pm \sqrt{1-2x_{13}^2}} & 0 & 0 \\ \frac{jx_{14}}{1 \pm \sqrt{1-2x_{14}^2}} & -\frac{jx_{14}}{1 \pm \sqrt{1-2x_{14}^2}} & 0 & 0 \end{pmatrix} \quad \text{(Eqn. 5)}$$

In choosing the signs, one must choose the two signs in expressions involving $x_{13}$ together, and choose the two signs involving $x_{14}$ together. Thus, there are a total of four possible sign choices and two real parameters $x_{13}$ and $x_{14}$ to vary. Also, constraints (see Eqn. 4) require that $x_{13}^2 > \frac{1}{2}$ and $x_{14}^2 > \frac{1}{2}$ for a lossless decoupling network.

Inspection of Eqn. 5 shows that as $x_{13}$, $x_{14} \to \infty$ the decoupling S matrix approaches $$S_u \to \frac{1}{\sqrt{2}} \begin{pmatrix} 0 & 0 & a & b \\ 0 & 0 & a & -b \\ a & a & 0 & 0 \\ b & -b & 0 & 0 \end{pmatrix} \quad \text{(Eqn. 6)}$$

where $a=\pm 1$ and $b=\pm 1$ may be chosen independently. The large reactance values required for this limit are easily implemented using small capacitors because their reactances $x_{13}=1/\omega Z_o C_{13}$ and $x_{14}=1/\omega Z_o C_{14}$ tend to infinity as the frequency tends to zero. The result is a nearly frequency independent decoupling network in the limit of low frequencies (the matrix $S_u$ approaches an ideal frequency-independent behavior as the frequency is reduced toward zero). Using only capacitors also provides an important advantage for integrated circuit (IC) implementations of the decoupling networks since compact capacitors are easily fabricated in an IC.

Figure 2B:
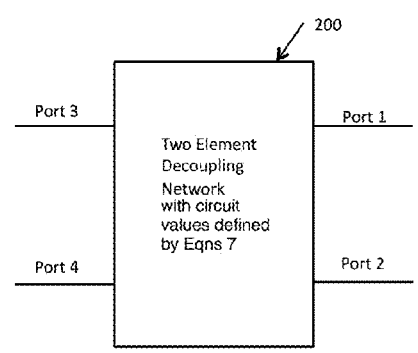
FIG. 2b depicts the two element Decoupling Network corresponding to FIG. 2 in a block diagram format, but with circuit element values corresponding to those of Eqns. 7 below.
Figure 3:
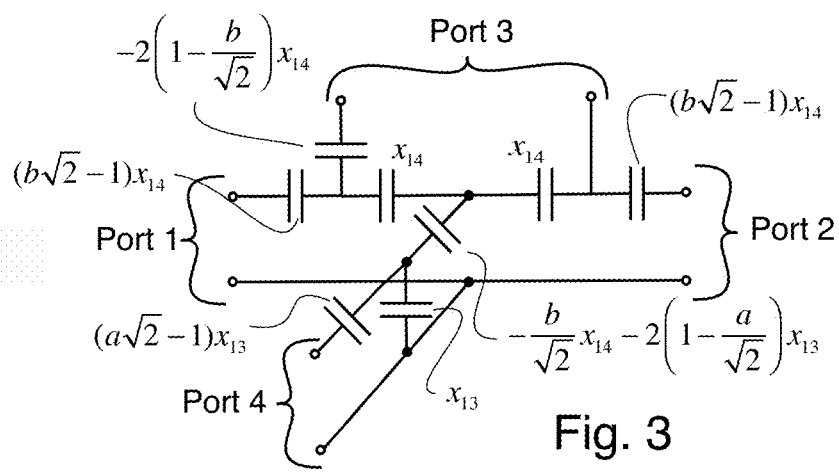
FIG. 3 is a schematic of decoupling network comprised only of capacitors.

For large $x_{13}$ and $x_{14}$ we find using Eqn. 4 that $x_{33} \approx \pm\sqrt{2}x_{13} = a\sqrt{2}x_{13}$ and $x_{44} \approx \pm\sqrt{2}x_{14} = b\sqrt{2}x_{14}$. The circuit element values for FIG. 2 are now given by $$x_{11} - x_{12} - x_{14} \cong (b\sqrt{2} - 1)x_{14} \quad \text{(Eqns. 6)}$$

$$x_{44} - 2x_{14} \cong -2\left(1 - \frac{b}{\sqrt{2}}\right)x_{14}$$

$$x_{12} \cong \frac{a}{\sqrt{2}}x_{13} - \frac{b}{\sqrt{2}}x_{14}$$

$$x_{12} - x_{13} \cong -\frac{b}{\sqrt{2}}x_{14} - \left(1 - \frac{a}{\sqrt{2}}\right)x_{13}$$

$$x_{33} - x_{13} \cong (a\sqrt{2} - 1)x_{14}$$

resulting in the circuit shown in FIG. 3. Note that some of the capacitance values must be negative to realize this circuit. For these negative capacitor elements non-Foster negative capacitance circuits are utilized. The result will be wideband decoupling for two identical antennas $10_1$ and $10_2$ coupled at Ports 1 and 2 of the decoupling network 200 shown in FIG. 2b, with the circuit element values as reflected by Eqns 7, which can be negative in certain cases unlike the prior art decoupling network of FIG. 2 which assumes positive circuit element values.

Figure 4:
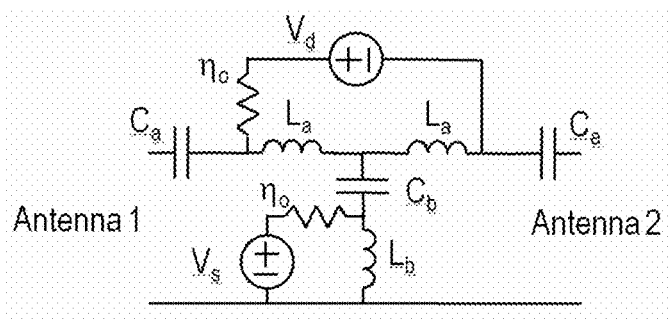
FIG. 4 depicts a circuit model for two small wire antennas. The sources Vs and Vd are equivalent voltage sources representing the incident E field.

We now choose the capacitance values (and signs a and b) appropriately to provide stable operation when the decoupling network is connected to antennas. To analyze stability we modeled the antennas as shown in FIG. 4. This model provides a reasonably good approximation to the S matrix for two small dipoles with close separation. The resistor-inductor combinations model the $1/f^2$ frequency dependence of the radiation resistance and the capacitance models the typical reactance curve for electrically small wire-like antennas. Circuit stability is determined by terminating the output ports (Ports 3 and 4) with capacitors in series with termination resistors (we include capacitors at these ports because we may wish to provide reactance cancellation at these ports) and computing the zeroes of the input impedances seen looking from the antenna voltage sources. The complex zeroes thus computed are the natural frequencies of oscillation of the circuit when connected to the voltage sources, and the circuit is stable when all the zeroes lie in the left half of the complex plane.

Carrying out this analysis is tedious so the details will not be presented here. But the result is that the circuit is stable for: $C_{13} > 0$ and $a=1$, or for $C_{13} < 0$ and $a=-1$. From an implementation standpoint it is desirable minimize the number of negative capacitances since these components are complicated and require more circuit area than positive capacitors. From FIG. 3 we see that choosing a positive capacitance for $C_{13}$ results in fewer negative capacitors so this is the choice we will make resulting in one embodiment the invention in the circuit in FIG. 5. Note that this embodiment uses two and only two negative capacitors.

We are still free to choose $C_{14}$ and b. Again, minimizing the number of negative capacitors we choose $C_{14} > 0$ and $b=1$. Letting $C = C_{13}/(\sqrt{2}-1) = C_{14}/\sqrt{2}-1)$ we obtain the circuit shown in FIG. 5. It contains only two negative capacitors. The circuit also provides significant reactance cancellation for small (capacitive) wire antennas by replacing the series capacitor C at ports 1 and 2 with antennas having about the same value of capacitance, as is shown in the embodiment FIG. 5a. Thus, the embodiment (circuit 100') of FIG. 5a uses the antenna capacitance ($C_{ant}$) as part of the decoupling network, effectively removing the antenna reactance and thus eliminating any need or desirability for the Non-Foster circuits NF of FIG. 1. The antenna capacitance is shown in dashed lines since it is typically the inherent capacitance of the antenna element as opposed to a capacitor added to the circuit (although in some embodiments $C_{ant}$ might reflect the combined capacitance of the antenna element itself and other residual or intentional capacitive couplings). Any residual reactance may be removed with matching networks at the isolated output ports 3 and 4 (ports 3 and 4 are output ports when the antennas are used for receiving RF signals—when transmitting RF signals ports 3 and 4 are input ports). This circuit is stable as long as the value of C is greater than the antenna capacitance $C_{ant}$. And as long as the value of C is only slightly greater than the antenna capacitance $C_{ant}$, the match is good and the Non-Foster circuits NF shown in FIG. 1 can be omitted, if desired.

Figure 5:
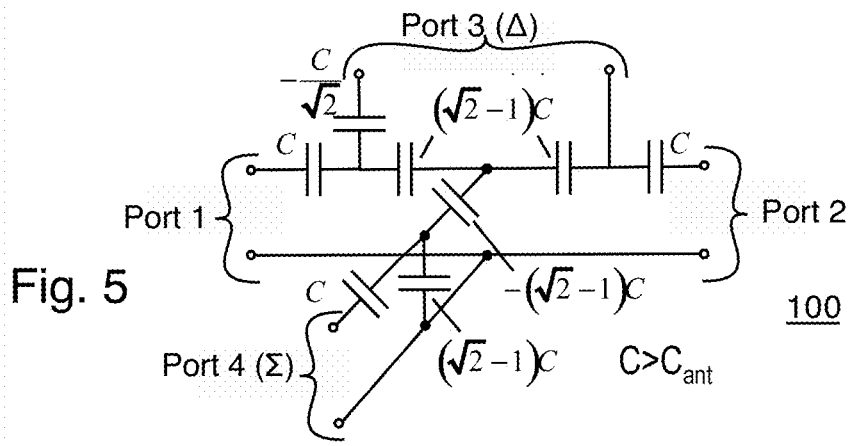
FIG. 5 depicts a circuit for broadband 180 deg coupler.

The 180 degree coupler circuit of FIG. 5 was simulated in a circuit simulator (Spice). The magnitudes of some of the S parameters are plotted in FIG. 6 (many of the S parameters are identical due to symmetry). The plot clearly shows nearly ideal performance over a frequency band that extends over a decade, with performance continuing to improve as the frequency is reduced. It can be noted that while decoupling is inherent in the magic Tee network, impedance matching is not. FIG. 6 shows in the plot for S11 less than 1% reflectance (−20 db) over a decade of frequency from 10 Mhz to 100 Mhz. As is important, the energy is evenly divided between the two antenna ports as shown by S13 and S14. A value of S13 and S14 of 3 db shows a 50/50 distribution of energy between the antenna ports 1 and 2.

The circuit model for two coupled antennas shown in FIG. 4 was then attached to the circuit model of FIG. 5, with the antenna capacitances $C_{ant}$ replacing the capacitor C in the decoupling circuit in series with ports 1 and 2. The resulting simulations indicate that the complete circuit was stable for $C_{ant} < C$ and unstable for $C_{ant} > C$, as predicted by analysis.

Figure 7:
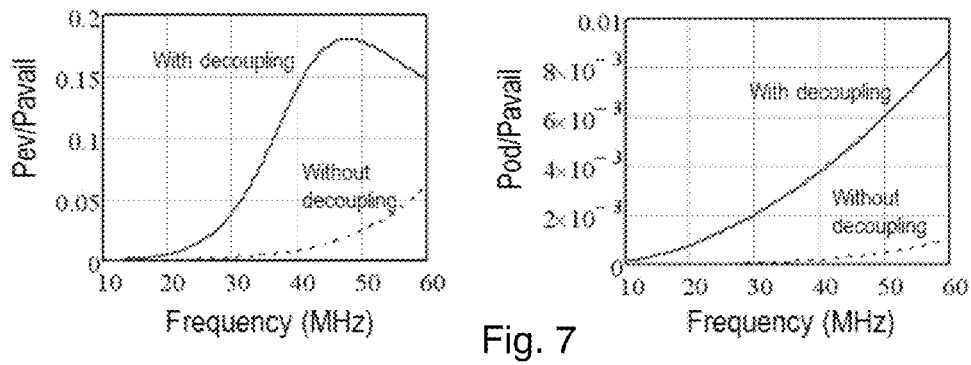
FIG. 7 provides plots of the ratio of received power to available power for the even (on the left hand side) and odd (on the right hand side) modes. Also plotted (dashed) is the same ratio in the absence of the decoupling network.

The receiving performance was simulated for two dipole antennas that are half a wavelength long and a quarter wavelength apart at 100 MHz. FIG. 7 shows a plot of the ratio of the power delivered to the output ports to the power available to the antenna for each of the two output ports (even and odd modes). Also plotted is the power delivered to the output ports with the decoupling network removed. The plots clearly show the dramatic increase in received power for both modes. For the odd mode the total amount of power received is a small fraction of what is available, but this is to be expected for such closely spaced dipoles since the odd mode exhibits extremely low radiation resistance. For these simulations the output port termination impedances are both 50 Ohms. The improvements in performance are almost entirely due to the reactance cancellation of the two antennas. Further improvements could be made with additional reactance cancellation at the output ports as well as impedance transformations to better match to the low modal resistances.

The broadband 180 degree hybrid coupler of FIG. 5 may also be used to provide broadband performance of a circularly arranged four element array antenna array of identical antenna elements $10_1$-$10_4$. Because this may also be considered a circular array with N=4, the decoupling matrix is independent of frequency and is given by as $$U = \frac{1}{2}\begin{pmatrix} 1 & 1 & 1 & 1 \\ 1 & -j & -1 & j \\ 1 & -1 & 1 & -1 \\ 1 & j & -1 & -j \end{pmatrix} \quad \text{(Eqn. 8)}$$

Due to the symmetry of the electromagnetic fields, the eigenvalues (e.g., modal reflection coefficients) for the $2^{nd}$ and 4th modes are identical (i.e., degenerate) so linear combinations of these columns of U also decouple the modes. Thus another matrix that decouples the antenna ports is $$U = \frac{1}{2}\begin{pmatrix} 1 & 1 & 1 & 1 \\ 1 & 1 & -1 & -1 \\ 1 & -1 & 1 & -1 \\ 1 & -1 & -1 & 1 \end{pmatrix} \quad \text{(Eqn. 9)}$$

Figure 8:
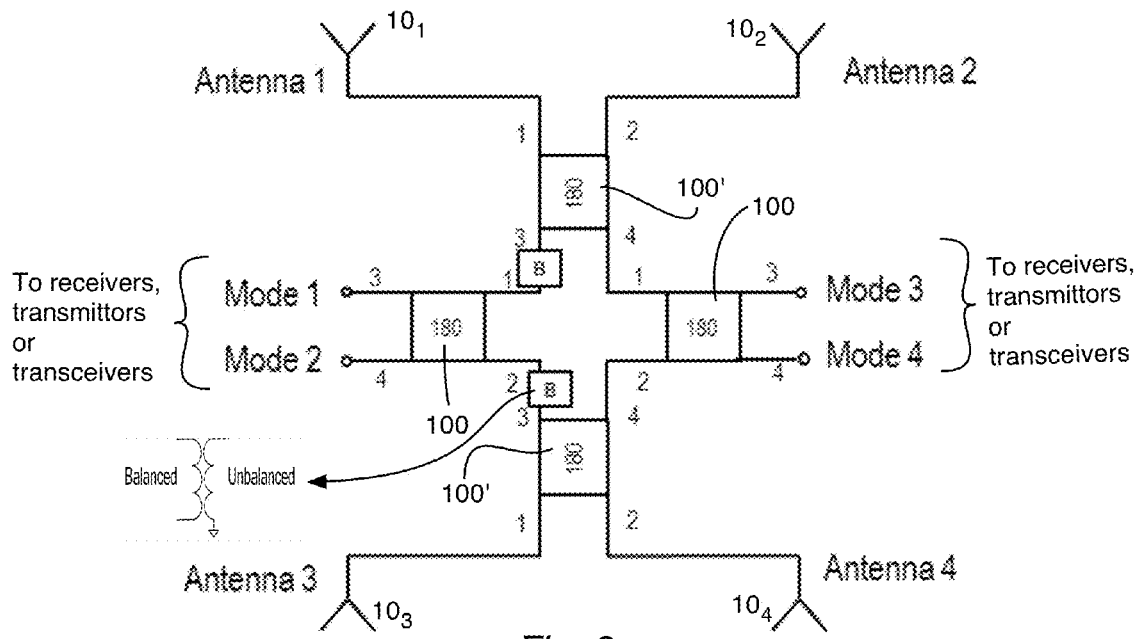
FIG. 8 is a circuit diagram for a decoupling network for a four element square array. The wideband 180 deg hybrid circuits may be interconnected as shown to provide wideband decoupling.

A circuit that provides this decoupling function may be constructed from four 180 deg hybrids 100 as shown in FIG. 8. Thus, four of the circuits 100 shown in FIG. 5 may be interconnected as shown in FIG. 8 to provide modal decoupling in a four element array embodiment of this invention. Indeed, for the two couplers directly coupled to antenna elements, the embodiment (circuit 100') of FIG. 5a may be used in preference over the embodiment of FIG. 5. The preferred connections by port numbers is disclosed by the numbers 1-4 (for ports 1-4) which appear adjacent each circuit 100 and 100'. For the circuit arrangement of FIG. 8 some of the circuits 100 and 100' may end up a negative capacitor being connected in series with a positive capacitor. Two series coupled capacitors can be replaced with a single capacitor possibly thereby simplifying the circuit somewhat.

Finally, upon a close inspection of circuits 100 and 100' of FIGS. 5 and 5a the reader will note that the ports 1, 2 and 4 thereof are unbalanced (note that one leg of each port 1, 2 and 4 is coupled in common) while port 3 is balanced. Thus, a balanced to unbalanced balun B is preferably used when port 3 is coupled to ports 1, 2 or 4. FIG. 8 shows two balanced to unbalanced baluns B (one such balun is between port 3 of the upper most circuit 100' and port 1 of the left most circuit 100 while the other such balun is connected between port 3 of the lower most circuit 100' and port 2 the left most circuit 100). One possible circuit representation of a balanced to unbalanced balun B is also given in FIG. 8. The turns ratio of each balun B could possibly be 1:1 but will depend on how the circuit of FIG. 8 is implemented.

This concludes the description including preferred embodiments of the present invention. The foregoing description including preferred embodiments of the invention has been presented for the purposes of illustration and description. It is not intended to be exhaustive or to limit the invention to the precise forms disclosed. Many modifications and variations are possible within the scope of the foregoing teachings. Additional variations of the present invention may be devised without departing from the inventive concept as set forth in the following claims.

What is claimed is:

1. A four port antenna decoupling network which has only two negative capacitors and four or more positive capacitors.

2. The four port antenna decoupling network of claim 1 wherein said four ports comprise first and second antenna ports and summation and difference ports, wherein two of said positive capacitors in said circuit configuration are either (i) connected in series with said antennas coupled, in use, with said first and second antenna ports or (ii) comprise inherent capacitances attributable to said antennas coupled, in use, with said first and second antenna ports and wherein one of said negative capacitors is coupled in series with said difference port and wherein the other one of said negative capacitors is arranged in a T configuration circuit with two positive capacitors, the T configuration circuit being coupled to said summation port.

3. The four port antenna decoupling network of claim 2 wherein said antennas are arranged in a superdirective array of antennas.

4. The four port antenna decoupling network of claim 1 wherein two of the four ports are summation and difference ports and wherein the other two of the four ports are each connected, in use, to an antenna, the four port antenna decoupling network providing, in use, signals at said summation and difference ports which signals have substantially identical signal strengths over a frequency bandwidth which comprises at least an octave of frequencies.

5. A four port antenna decoupling network having:
   a. first and second ports coupled, in use, either directly to antenna elements or indirectly to antenna elements;
   b. third and fourth ports coupled, in use, either directly or indirectly to radio transmitting and/or receiving apparatus;
   c. the first and second ports each having first connection points and second connection points, the first connection points of the first and second ports being directly connected to each other, the second connection points of the first and second ports being connected to each other via at least a pair of positive capacitors, the pair of positive capacitors having a common junction point between them;
   d. the third port having first connection points and second connection points, the first connection point of the third port being capacitively coupled to a first one of said pair of positive capacitors with a first negative capacitor and the second connection point of the third port being directly coupled to a second one of said pair of positive capacitors;
   e. the fourth port having first connection points and second connection points, the first connection point of the fourth port being directly coupled to the first connection points of the first and second ports, and the second connection point of the fourth port being coupled to (i) the first connection point of the fourth port and (ii) the common junction point between the pair of positive capacitors via a network of three capacitors one of which is a negative capacitor.

6. The four port antenna decoupling network of claim 5 wherein second connection points of the first and second ports are connected to said a pair of positive capacitors by another pair of capacitors, the first mentioned pair of capacitors and the another pair of capacitors all being connected in series between the second connection point of the first port and the second connection point of the second port.

7. The four port antenna decoupling network of claim 6 wherein the another pair of capacitors are each at least partially embodied by one of said antenna elements.

8. The four port antenna decoupling network of claim 5 wherein said antennas are arranged in a superdirective array of antennas.

9. A method of improving radio frequency receiving performance of two element and four element antenna arrays using one or more wideband decoupling circuits wherein each of said wideband decoupling circuits contain a maximum of two non-Foster components.

10. The method of claim 9 wherein the two non-Foster components each simulate a negative capacitor.

11. An eight port antenna decoupling network comprising four four-port couplers arranged in a configuration providing four ports four coupling to antenna elements and another four ports for coupling to receiving and/or transmitting apparatus, where at least two of the four-port couplers each have two negative capacitors and four or more positive capacitors.

12. The eight port antenna decoupling network of claim 11 wherein at least another two of the of the four-port couplers each have only one negative capacitor and four or more positive capacitors.

13. A four port antenna decoupling and impedance matching network comprising a plurality of reactance elements arranged in a circuit configuration and wherein each of the plurality reactance elements of said circuit configuration are either capacitors or non-Foster circuits synthesizing negative capacitors.

14. The port antenna decoupling and impedance matching network of claim 13 wherein two of said four ports are sum and difference ports and wherein the other two of said four ports are each connected, in use, to an antenna, the port antenna decoupling and impedance matching network providing, in use, signals at said sum and difference ports which signals have substantially identical signal strengths over a frequency bandwidth which comprises at least an octave of frequencies.

15. A four port antenna decoupling network comprising: two negative capacitors and four or more positive capacitors, wherein the two negative capacitors and the four or more positive capacitors are coupled together in a circuit configuration having four ports.

16. The four port antenna decoupling network of claim 15 wherein two of the four ports are summation and difference ports and wherein the other two of the four ports are each connected, in use, to an antenna, the four port antenna decoupling network providing, in use, signals at said summation and difference ports which signals have substantially identical signal strengths over a frequency bandwidth which comprises at least an octave of frequencies.

17. A method of improving the performance of two element and four element antenna arrays using one or more wideband decoupling circuits having a bandwidth at least an octave wide and wherein each of said wideband decoupling circuits contain a maximum of two non-Foster components.

18. The method of claim 17 wherein the two non-Foster components each simulate a negative capacitor.

* * * * *